US008324725B2

(12) United States Patent
Khandros et al.

(10) Patent No.: US 8,324,725 B2
(45) Date of Patent: Dec. 4, 2012

(54) STACKED DIE MODULE

(75) Inventors: Igor Y. Khandros, Orinda, CA (US); Charles A. Miller, Fremont, CA (US); Bruce J. Barbara, Discovery Bay, CA (US); Barbara Vasquez, Lafayette, CA (US)

(73) Assignee: FormFactor, Inc., Livermore, CA (US)

( * ) Notice: Subject to any disclaimer, the term of this patent is extended or adjusted under 35 U.S.C. 154(b) by 677 days.

(21) Appl. No.: 11/160,477

(22) Filed: Jun. 24, 2005

(65) Prior Publication Data

US 2006/0076690 A1 Apr. 13, 2006

Related U.S. Application Data

(60) Provisional application No. 60/613,286, filed on Sep. 27, 2004.

(51) Int. Cl.
*H01L 23/485* (2006.01)
*H01L 21/00* (2006.01)
*H01L 25/16* (2006.01)
*H01L 25/065* (2006.01)

(52) U.S. Cl. ........ 257/723; 257/668; 257/686; 257/691; 257/698; 257/724; 257/730; 257/731; 257/777; 257/778; 257/786; 257/E21.508; 257/E21.525; 257/E23.021; 257/E23.078; 257/E25.011

(58) Field of Classification Search .................. 257/666, 257/676, 777, E23.036, E23.052, 693, 778, 257/783, E23.079, E25.023
See application file for complete search history.

(56) References Cited

U.S. PATENT DOCUMENTS 5,512,783 A * 4/1996 Wakefield et al. ............ 257/693
5,585,675 A * 12/1996 Knopf ........................... 257/774
5,969,952 A 10/1999 Hayashi et al.
5,998,864 A * 12/1999 Khandros et al. ............. 257/723
6,104,084 A * 8/2000 Ishio et al. .................... 257/666
6,351,028 B1 2/2002 Akram
6,444,576 B1 9/2002 Kong
6,492,726 B1 * 12/2002 Quek et al. .................... 257/723
6,627,980 B2 * 9/2003 Eldridge ....................... 257/678
6,882,546 B2 4/2005 Miller
6,890,798 B2 * 5/2005 McMahon .................... 438/122
2001/0010064 A1 7/2001 Kanekawa et al.
2003/0203537 A1 10/2003 Koopmans
2003/0207515 A1 11/2003 Tan et al.
2004/0000707 A1 1/2004 Roper et al.
2004/0113250 A1 6/2004 Khandros et al.
2004/0164391 A1 8/2004 Okamura
2005/0161797 A1 7/2005 Miller

FOREIGN PATENT DOCUMENTS

JP 57-031166 2/1982
JP 04-199566 7/1992
JP 05-206375 8/1993
JP 06-291250 10/1994
JP 2002-261232 9/2002

* cited by examiner

*Primary Examiner* — Zandra Smith
*Assistant Examiner* — Tsz Chiu
(74) *Attorney, Agent, or Firm* — Kirton & McConkie

(57) ABSTRACT

Semiconductor dies are stacked offset from one another so that terminals located along two edges of each die are exposed. The two edges of the dies having terminals may be oriented in the same direction. Electrical connections may connect terminals on one die with terminals on another die, and the stack may be disposed on a wiring substrate to which the terminals of the dies may be electrically connected.

22 Claims, 8 Drawing Sheets

100 114 138 140 142 108 148 146 122 102 136 116 124 104 120 118 126 128 112 106 110 144

11
1006
1008
1054
1036
1002
1110
1060
1052
1034
1058
1050
1032
1018
1056
1112
1028
1004
1024
1020
1022
1012
1030
1026
1038
1016
1014
1040
1008
1042
1010
11

STACKED DIE MODULE

This application claims the benefit of U.S. provisional patent application 60/613,286, filed Sep. 27, 2004, entitled System And Method For Stacking Electronic Devices by Igor Y. Khandros, Charles A Miller, Bruce J. Barbara, and Barbara Vasquez.

BACKGROUND

As is known, a semiconductor die typically consists of an electronic circuit formed on a semiconductor material, such as silicon or gallium arsenide. Terminals (e.g., bond pads) typically provide an interface for signals to and from the die. Often, a plurality of dies are attached to a wiring substrate, such as a printed circuit board, and interconnected to form a multi-die module. There are many examples of such multi-die modules. For example, multiple memory dies are often disposed in a single row on a printed circuit board and electrically connected to each other and to input/output terminals of the printed circuit board in what is often termed a single inline memory module. A similar module but with memory dies disposed in two rows is often referred to as a dual inline memory module. Yet another example of a multi-die module is a printed circuit board with a processor die and one or more memory dies attached to the printed circuit board and electrically connected to each other and to input/output terminals of the printed circuit board. The following disclose yet other examples of multi-die modules: U.S. Pat. No. 5,998,864; U.S. Pat. No. 6,627,980; U.S. Pat. No. 6,882,546; and U.S. Patent Application Publication No. 2004/0113250. Each of the foregoing is incorporated herein in its entirety by reference.

For many applications, it is advantageous to increase the density of the dies in a multi-die module. It may also be advantageous to configure and arrange the dies to facilitate interconnecting the dies to each other and to the printed circuit board.

SUMMARY

In an exemplary embodiment of the invention, terminals of a plurality of dies are arranged along two edges of the dies. The dies are stacked with the two edges of the dies oriented in the same direction, and the dies in the stack are offset to expose the terminals on each die. Electrical connections may connect terminals on one die with terminals on another die. The stack may be disposed on a wiring substrate, and the terminals of the dies may be electrically connected to terminals on the wiring substrate. A bus may be formed interconnecting the dies in the stack by electrically connecting similar terminals disposed on different dies. A plurality of stacks of dies may be disposed on a wiring substrate and electrically connected to form a module, such as a memory module. The die stack may be disposed in a cavity of a multilayered wiring substrate and electrically connected to terminals of the wiring substrate.

DETAILED DESCRIPTION OF EXEMPLARY EMBODIMENTS

This specification describes exemplary embodiments and applications of the invention. The invention, however, is not limited to these exemplary embodiments and applications or to the manner in which the exemplary embodiments and applications operate or are described herein.

Figure 1:
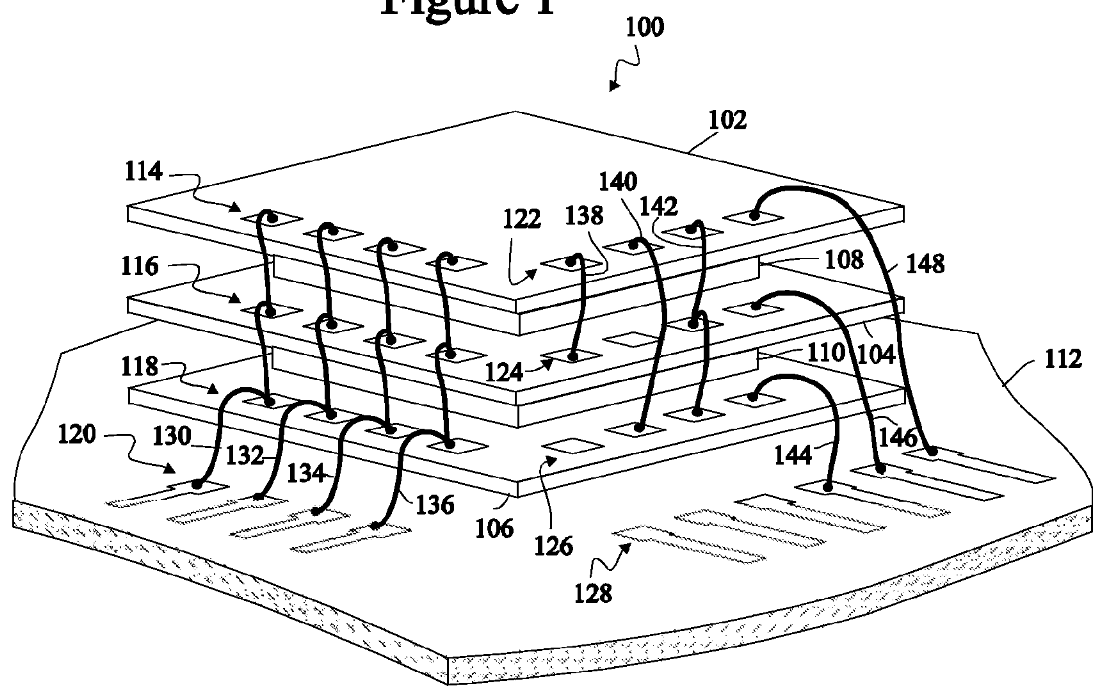
FIG. 1 illustrates a perspective view of an exemplary die stack.
Figure 2:
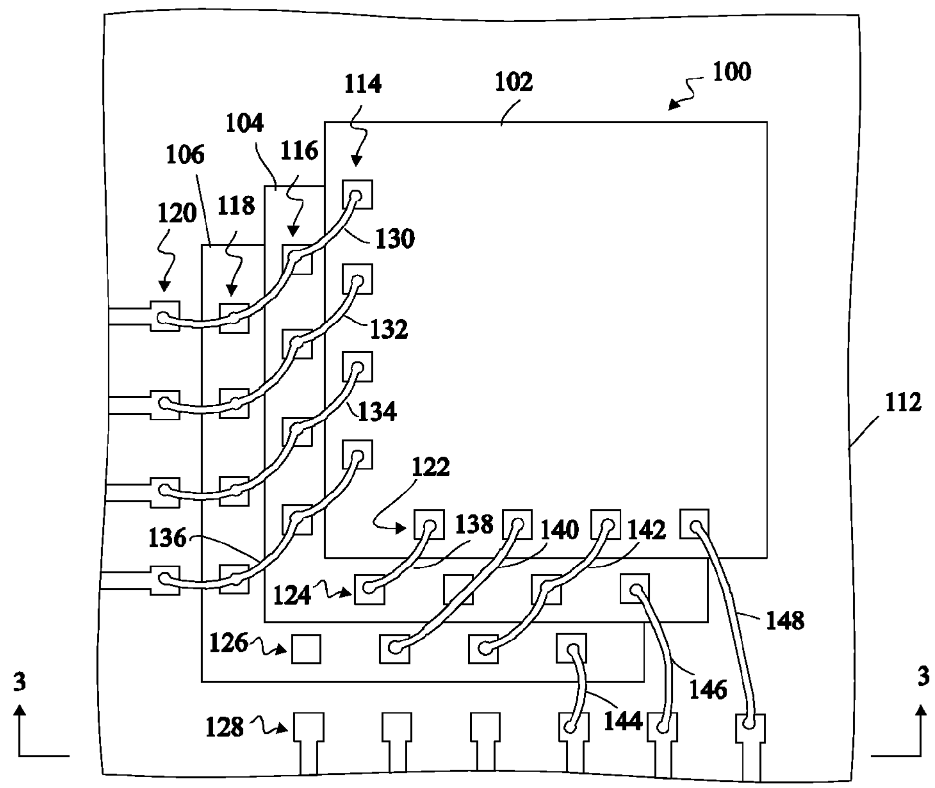
FIG. 2 illustrates a top view of the die stack of FIG. 1.
Figure 3:
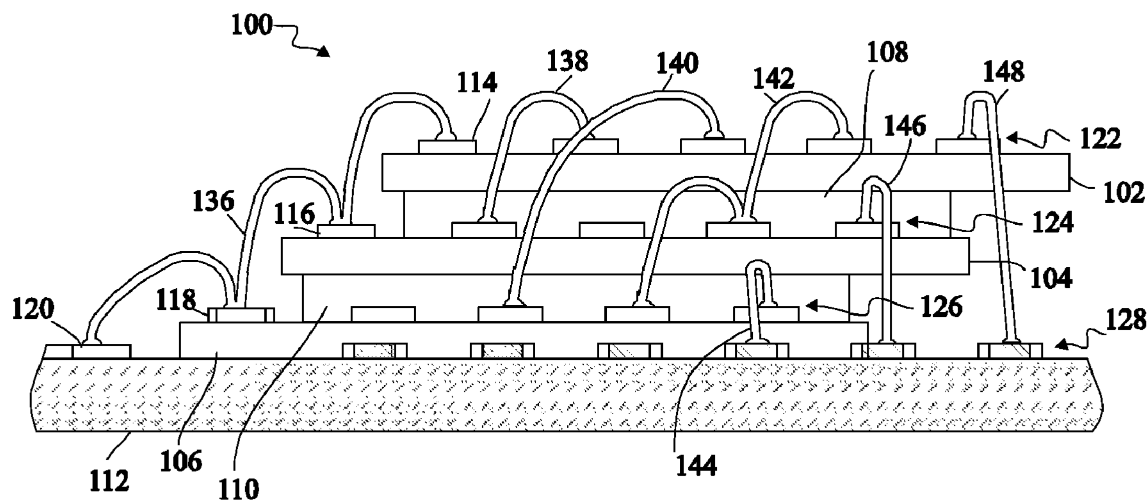
FIG. 3 illustrates a cross-sectional side view of the die stack of FIGS. 1 and 2.

FIGS. 1-3 illustrate an exemplary embodiment of the invention in which a plurality of semiconductor devices are stacked to form a multi-device module. (FIG. 1 shows a perspective view, FIG. 2 shows a top view, and FIG. 3 shows a side cross-sectional view. In each of FIGS. 1-3, the wiring substrate 112 is shown in partial view.) Although three semiconductor devices 102, 104, and 106 are shown in the stack 100 of FIGS. 1-3, more or fewer semiconductor devices may be in the stack 100. For example, the stack 100 may include only two semiconductor devices or only one semiconductor device. Alternatively, the stack 100 may include four, five, six, or more semiconductor devices. Moreover, the semiconductor devices in the stack 100 may be bare dies (e.g., known good dies) or may be packaged dies or may be a combination of bare and packaged dies. In the example shown in FIGS. 1-3, semiconductor devices 102, 104, and 106 are bare dies and will hereinafter be referred to as dies.

In the exemplary stack 100 shown in FIGS. 1-3, die 106 is attached directly to a wiring substrate 112 (which is shown in partial view), die 104 is attached to and stacked on top of die 106, and die 102 is attached to and stacked on top of die 104. Attachment element 108 attaches dies 102 and 104 to each other, and attachment element 110 attaches dies 104 and 106 to each other. Attachment elements 108 and 110 may be die bonding material. Alternatively, attachment elements 108 and 110 may include both die bonding material and a spacing element designed to provide a particular space between the dies. Although not shown in FIGS. 1-3, die 106 may be attached to the wiring substrate 112 using a similar attachment element. Wiring substrate 112 may be any type of wiring substrate suitable for supporting one or more die stacks 100 and providing electrical connections to and from the dies in the stack 100 or stacks. Nonlimiting examples of such wiring substrates include a printed circuit board, a flex circuit material, a ceramic substrate, etc. Such wiring substrates may include conductive traces on one or more layers of the wiring substrate and conductive vias, if needed, to interconnect traces on different layers.

As shown in FIGS. 1-3, the terminals (e.g., bond pads) on dies 102, 104, and 106 are arranged along two sides of each die, and the dies 102, 104, and 106 are offset one from another to expose the bond pads. More specifically, die 102 includes two rows of bond pads 114, 122, which are located along two edges of die 102. Die 104 similarly includes two rows of bond pads 116 and 124, which are also located along two edges of die 104, and die 106 includes two rows of bond pads 118 and 126 located along two edges of die 106. As best seen in FIG. 2, the dies 102, 104, and 106 are stacked in an offset manner so that the two rows of bond pads on each die are exposed. Specifically, die 104 is offset from die 106 so that the two rows of bond pads 118 and 126 on die 106 are exposed. Similarly, die 102 is offset from die 104 so that the two rows of bond pads 116 and 124 on die 104 are exposed. In this way, the bond pads on each of the dies 102, 104, and 106 in stack 100 are readily connected to each other and/or terminals on the wiring substrate 112. (In FIGS. 1-3, two rows of terminals 120 and 128 are shown on wiring substrate 112.

The placement of the bond pads (e.g., rows 114, 116, 118, 122, 124, 126) near edges of the dies 102, 104, and 106, and the offset stacking of the dies facilities making electrical connections between bond pads on different dies and between a bond pad on a die and a terminal on the wiring substrate 112. For example, as shown in FIGS. 1-3, connection 148 connects a terminal in terminal row 128 with a bond pad on die 102 in bond-pad row 122. Connections 146 and 144 similarly connect terminals in terminal row 128 with, respectively, a bond pad in bond-pad row 124 on die 104 and a bond pad in bond-pad row 126 on die 106. Connection 138 connects a bond pad in bond-pad row 124 on die 104 with a bond pad in bond-pad row 122 on die 102. Connection 140 connects a bond pad in bond-pad row 122 on die 102 with a bond pad in bond-pad row 126 on die 106, and connection 142 connects three bond pads, each in one of bond-pad rows 122, 124, and 126 on dies 102, 104, and 106.

As shown by connections 130, 132, 134, and 136, bond pads on adjacent dies are readily connected in a bus structure, which may also be connected to terminals on the wiring substrate 112. For example, as best seen in FIGS. 1 and 2, connections 130, 132, 134, and 136 form a four-bit bus in which each connection 130, 132, 134, and 136 interconnects three bond pads, one on each of dies 102, 104, and 106, and a terminal on wiring substrate 112. The dies 102, 104, and 106 of stack 100 are thus readily connected in a bus configuration. The bond pads on each of the dies 102, 104, and 106 and the terminal on wiring substrate 112 are preferably oriented such that bond pads on each die and the terminal on the wiring substrate 112 that correspond to a common signal type or function are aligned. For example, the four-bit bus formed by connections 130, 132, 134, and 136 may be an address bus, and the left most bond pad in each of rows 114, 116, 118 and the left most terminal in row 120 may correspond to the least-significant bit in the address, the next terminal moving to the right in each of bond pad or terminal in rows 114, 116, 118, and 120 may correspond to the next bit in the address, the next bond pad or terminal moving to the right in each of rows 114, 116, 118, and 120 may correspond to the next bit in the address, and the right-most bond pad or terminal in rows 114, 116, 118, and 120 may correspond to the most-significant bit in the address. The bond pads or terminals in rows 122, 124, 126, and 128 may be similarly aligned in accordance with common function to facilitate making connections 138, 140, 142, 144, 146, and 148.

The connections 130, 132, 134, 136, 138, 140, 142, 144, 146, and 148 illustrated in FIGS. 1-3 are exemplary only, and any connection may be made between any one or more of the bond pads and or terminals shown in FIGS. 1-3. Moreover, connections 130, 132, 134, 136, 138, 140, 142, 144, 146, and 148 may be made in any suitable manner. For example, the connections may be made using well known wire bonding techniques. That is, connections 130, 132, 134, 136, 138, 140, 142, 144, 146, and 148 may comprise wires that are bonded to one or more of the bond pads and/or terminals shown in FIGS. 1-3. Indeed, connections among three or more bond-pads and/or terminals may be made using stitch bonding. For example, each of connections 130, 132, 134, and 136, which form a bus structure as discussed above, may be formed by forming a first bond to one of the terminals in terminal row 120 and then stitch bonding the same wire to a bond pad in bond-pad row 118 on die 106 without severing the wire, and then bonding the same wire to a bond pad in bond-pad row 116 on die 104 without severing the wire, and then bonding the same wire to a bond pad in bond-pad row 114 on die 102, as shown in FIGS. 1-3. Preferably, the dies 102, 104, and 106 are offset in stack 100 one from another sufficiently to allow access to the bond pads in each row 114, 116, 118, 122, 124, and 126 by a wire bonding tool to bond wires to any of those bond pads as well as any terminal in terminal rows 120 and 128.

Figure 4:
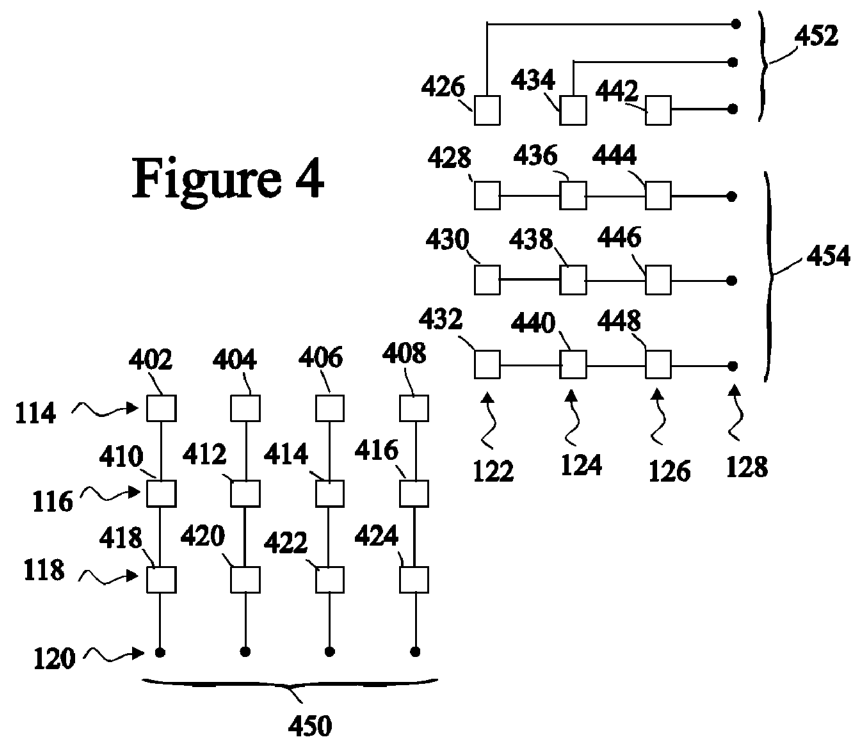
FIG. 4 illustrates an exemplary configuration of the die stack of FIGS. 1-3.
Figure 5:
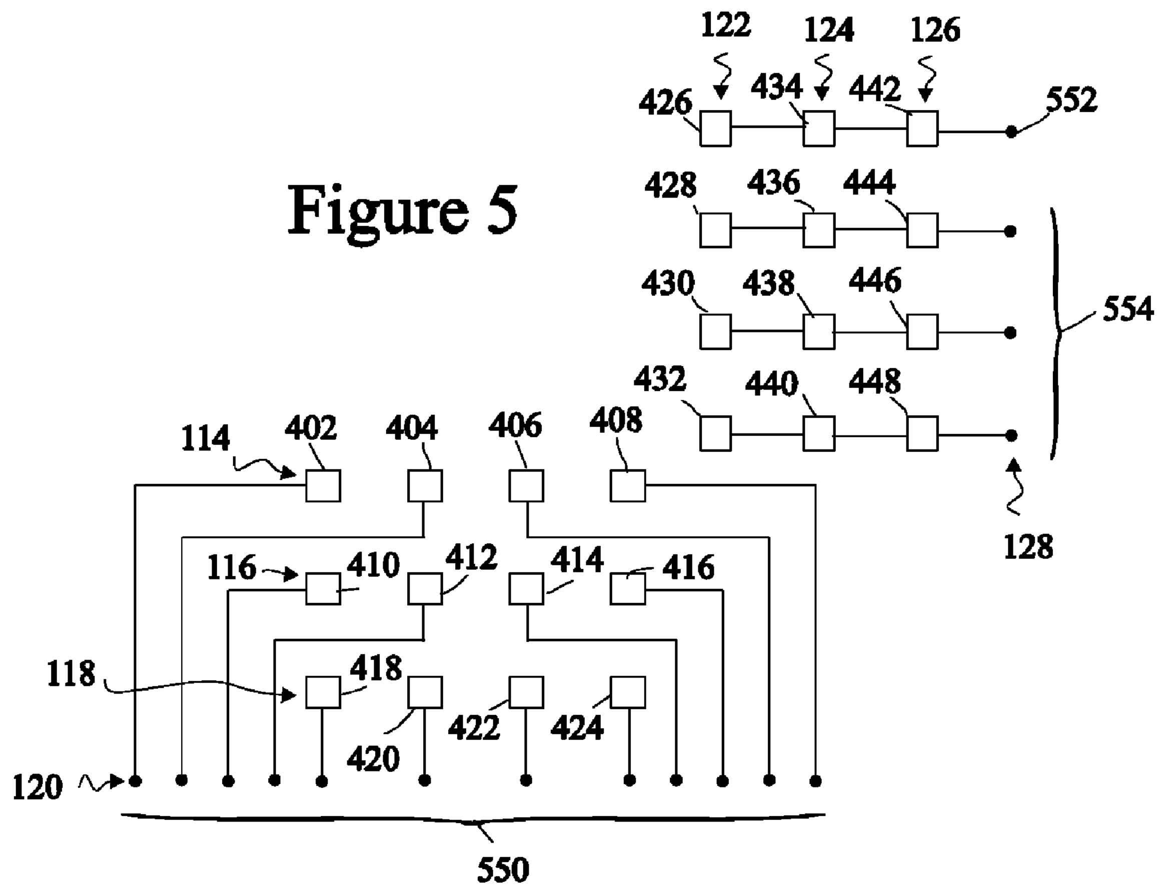
FIG. 5 illustrates another exemplary configuration of the die stack of FIGS. 1-3.

FIGS. 4 and 5 schematically illustrate two exemplary connection configurations for the exemplary stack 100 of FIGS. 1-3. In both the example shown in FIG. 4 and the example shown in FIG. 5, the dies 102, 104, and 106 are memory dies, and each die has four data inputs and/or outputs, three address inputs, and one chip enable input. For simplicity, FIGS. 4 and 5 are shown schematically, and dies 102, 104, and 106 are not explicitly shown. Nevertheless, bond-pad rows 114 and 122 are on die 102, bond-pad rows 116 and 124 are on die 104, and bond-pad rows 118 and 126 are on die 106, as shown in FIGS. 1-3. Terminals in terminal rows 120 and 128 are disposed on the wiring substrate 112 as shown in FIGS. 1-3.

As shown in FIGS. 4 and 5, bond-pad row 114 on die 102 includes bond pads 402, 404, 406, and 408; and bond-pad row 122 also on die 102 includes bond pads 426, 428, 430, and 432. Similarly, bond-pad row 116 on die 104 includes bond pads 410, 412, 414, and 416; and bond-pad row 124 also on die 104 includes bond pads 434, 436, 438, and 440. Bond-pad rows 118 and 126 on die 106 likewise respectively include bond pads 418, 420, 422, 424, 442, 444, 446, and 448.

In the examples shown in FIGS. 4 and 5, data input and/or output bond pads are disposed along one edge of each die, and address and command bond pads are disposed along the other edge of each die. More specifically, each of the bond pads in bond-pad row 114 is a data input and/or output pad for die 102; pads 428, 430, and 432 in row 122 are address inputs for die 102; and pad 426 is a chip enable input for die 102. Likewise, each of the bond pads in bond-pad row 116 is a data input and/or output pad for die 104; pads 436, 438, and 440 in row 124 are address inputs for die 104; and pad 434 is a chip enable input for die 104. Similarly, each of the bond pads in bond-pad row 118 is a data input and/or output pad for die 106; pads 444, 446, and 448 in row 126 are address inputs for die 106; and pad 442 is a chip enable input for die 106. As mentioned above, bond pads on each of the dies and a terminal on the wiring substrate that correspond to common data or control signals or other common functions may be aligned to facilitate formation of electrical connections between dies and between dies and the wiring substrate. For example, the dies may be stacked such that bond pads 402, 410, and 418 are aligned with each other and with the terminal in row 120 on the wiring substrate that corresponds to the same signal or function. More generally stated, bond pads and terminals (on adjacent dies and/or the wiring substrate) that are to be connected to each other may be disposed adjacent one another and/or similarly aligned or oriented.

In the example shown in FIG. 4, a four-bit data input and/or output bus 450 is formed by electrically connecting pads 402, 410, and 418 to form one bit of the data bus 450; pads 404, 412, and 420 to form a second bit of the data bus 450; pads 406, 414, and 422 to form a third bit of the data bus 450; and pads 408, 416, and 424 to form a fourth bit of the data bus 450. The foregoing connections may be made as shown by connections 130, 132, 134, and 136 in FIGS. 1-3. In this manner, a data bus 450 is created and each of the dies 102, 104, and 106 in stack 100 is connected to the data bus 450. A three-bit address bus 454 is similarly created, as also shown in FIG. 4, by electrically connecting address pads 428, 436, and 444 to form a first bit of the address bus 454; address pads 430, 438, and 446 to form a second bit of the address bus 454, and address pads 432, 440, and 448 to form a third bit of the address bus 454. Address pads 428, 436, and 438 may be connected with a connection like connection 130 shown in FIGS. 1 and 2. Address pads 430, 438, and 446 may also be connected with a connection like connection 130 shown in FIGS. 1 and 2 as can address pads 432, 440, and 448. Three chip enable signals (collectively represented by 452) are connected to chip enable pads 426, 434, and 442. Each of pads 426, 434, and 442 may be connected to one of three control terminals on a printed circuit board using connections like connections 144, 146, and 148 of FIGS. 1-3. In the exemplary connection configuration show in FIG. 4, stack 100 is configured such that each die 102, 104, and 106 is connected to the same data bus 450 and address bus 454, and each die 102, 104, and 106 is separately enabled by a different control signal 452. Configured as shown in FIG. 4, stack 100 stores four-bit words and is able to store three times the number of four-bit words as any one of dies 102, 104, and 106 is capable of storing.

In the exemplary configuration shown in FIG. 5, stack 100 is connected to store the same number of words as any one of dies 102, 104, or 106, but each stored word is three times as wide (in this example, twelve bits wide) as a word that could be stored in one of dies 102, 104, or 106. As shown in FIG. 5, the chip enable pads 426, 434, and 442 are electrically connected so that all three dies 102, 104, and 106 are enabled at once by the same enable single 552. Chip enable pads 426, 434, and 442 may be interconnected using a connection like connection 130 in FIGS. 1 and 2. Like the configuration of FIG. 4, the address pads on each die 102, 104, and 106 in FIG. 5 are interconnected so that the address pads on each die 102, 104, and 106 are connected via a bus structure 554 that presents the same address to each die 102, 104, and 106. Each of the data pads 402, 404, 406, 408, 410, 412, 414, 416, 418, 420, 422, and 424 on dies 102, 104, and 106 is connected to a distinct connection, which forms a twelve-bit data bus 550. Each of data pads 402, 404, 406, 408, 410, 412, 414, 416, 418, 420, 422, and 424 may be connected to a terminal on a wiring substrate by a connection like connections 144, 146, or 148 of FIGS. 1-3. Configured as shown in FIG. 5, stack 100 stores twelve-bit words, four bits in each of dies 102, 104, and 106.

Figure 6:
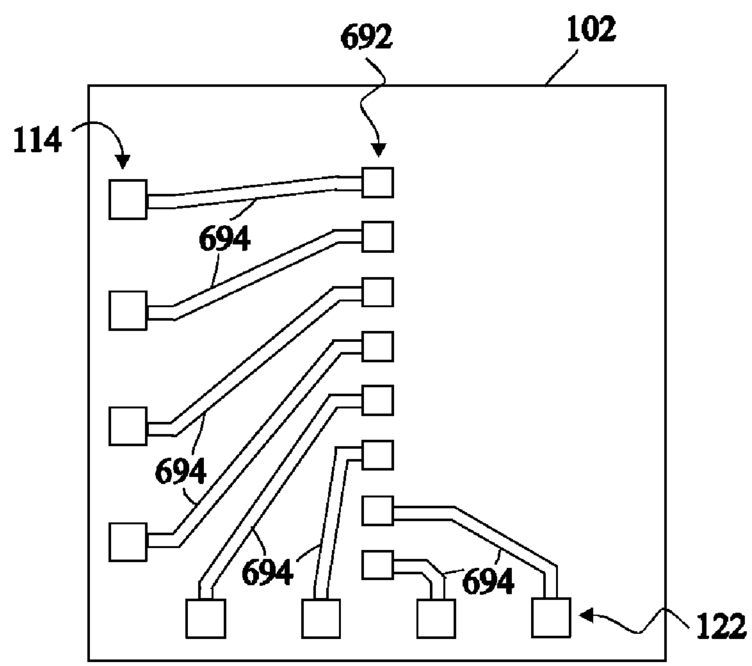
FIG. 6 illustrates exemplary redistribution of native bond pad locations on a die of the die stack of FIGS. 1-3.

Often, the native bond pads of a semiconductor die are not be disposed along two edges of the die as shown for dies 102, 104, and 106 in FIGS. 1 and 2. Thus, one or more layers of redistribution traces may be included on a die to connect the native bond pads to edge bond pads. FIG. 6 illustrates an example in which bond pads in bond-pad rows 114 and 122 of die 102 are added to die 102 and electrically connected to the native bond pads 692 by redistribution traces 694. In this manner, bond pads may be disposed along two edges of a die regardless of the location of the native bond pads of the die. In the example shown in FIG. 6, the native bond pads 692 of die 102 are disposed in a lead-on-center configuration, and a single layer of redistribution traces 694 connect the native bond pads 692 to the edge bond pads 114 and 122. Of course, multiple layers of redistribution traces could alternatively be used. Moreover, the use of redistribution traces to connect the native bond pads of a die to edge bond pads is not limited to dies with native bond pads in a lead-on-center configuration. It is, of course, possible to design a die such that its native bond pads are located along two edges of a die and avoid the need for redistribution traces.

Figure 7A:
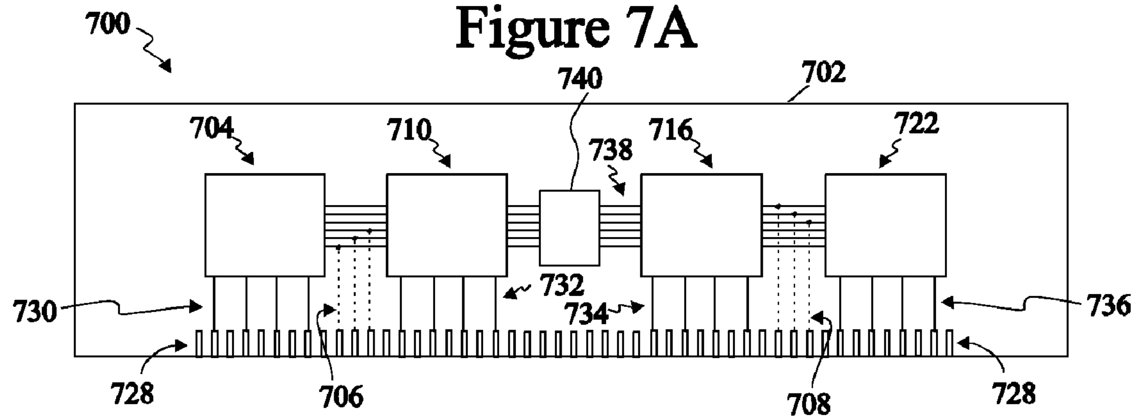
FIG. 7A illustrates a top view of an exemplary multi-stack module.
Figure 7B:
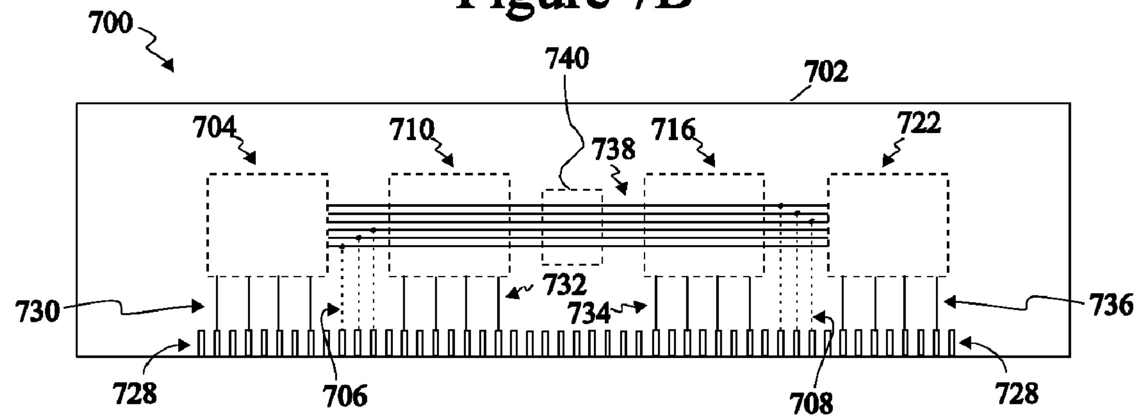
FIG. 7B illustrates the exemplary multi-stack module of FIG. 7A without the die stacks or other electronic elements.

FIG. 7A illustrates an exemplary multi-stack module 700, which includes four die-stacks 704, 710, 716, and 722. The die-stacks 704, 710, 716, and 722 are attached to a wiring substrate 702 (which may be generally like wiring substrate 112), which includes edge connectors 728, four data buses 730, 732, 734, and 736, and address/control bus 738. A register (i.e., buffer) die 740 is also attached to wiring substrate 702. FIG. 7B illustrates wiring substrate 702 without die stacks 704, 710, 716, 722 or register die 740; FIG. 7B includes only outlines to indicate the positions of those die stacks. The exemplary multi-stack module 700 illustrated in FIG. 7A illustrates an exemplary use of a die stack, such as a die stack 100 shown and described with regard to FIGS. 1-6. Multi-stack module 700 is, of course, exemplary only, and many different arrangements, numbers, and types of semiconductor dies may be stacked and configured into a multi-stack module.

Figure 7C:
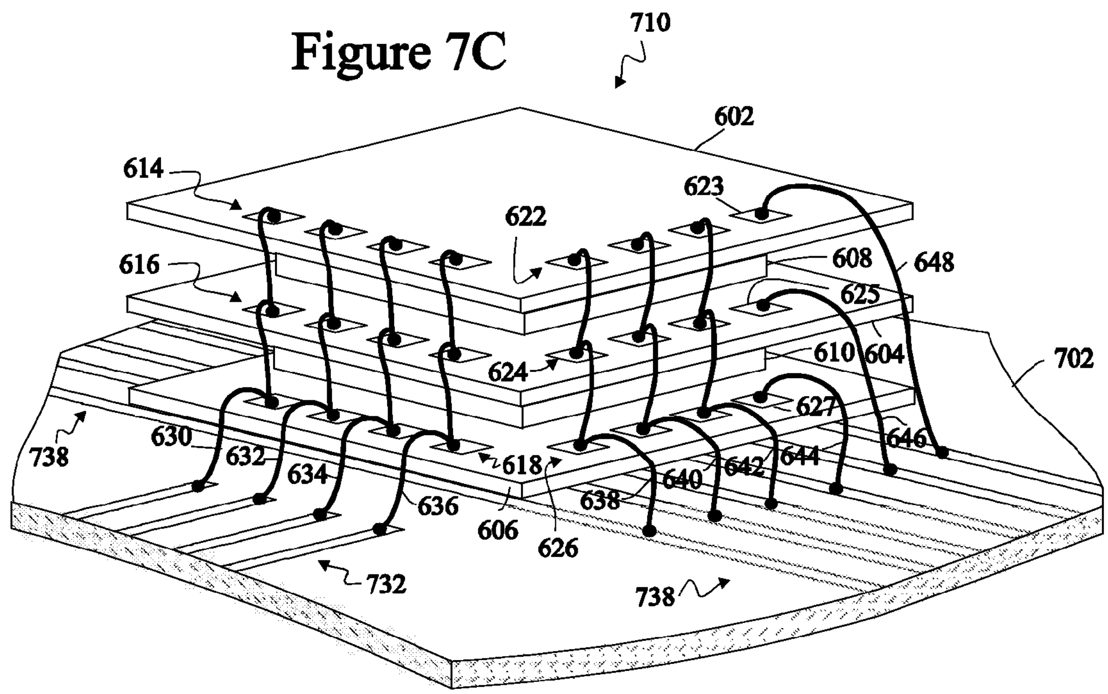
FIG. 7C illustrates one exemplary die stack from the multi-stack module of FIG. 7A.

As one nonlimiting example, the multi-stack module 700 shown in FIG. 7A may be a read-only memory module having four identical die stacks 704, 710, 716, and 722, each stack comprising three read-only memory dies. FIG. 7C illustrates die stack 710, and die stacks 704, 716, and 722 are similar. As shown in FIG. 7C, die stack 710 includes three read-only memory dies 602, 604, and 606 arranged and stacked like the die-stack 100 shown in FIGS. 1-3 and discussed above. Attachment elements 608 and 610 may be similar to attachment elements 108 and 110 in FIGS. 1 and 2. Each die includes two rows of bond pads disposed along two edges of the dies: one row of four data output bond pads, and a second row having three address bond pads and one die enable bond pad. Row 614 on die 602, row 616 on die 604, and row 618 on die 606 are data output bond pads. Row 622 on die 602 includes three address bond pads and one die enable bond pad 623. Row 624 on die 604 and row 626 on die 606 likewise each include three address bond pads and one die enable bond pad 625 and 627.

As also shown in FIG. 7C, connection 630 electrically connects one data bond pad on each die 602, 604, and 606 to each other and to one trace of data bus 732. Connections 632, 634, and 636 similarly electrically connect one data bond pad on each die 602, 604, and 606 to each other and to one trace of data bus 732 on wiring substrate 702. The data output bond pads of each of the dies 602, 604, and 606 in the die stack 710 are thus all connected in a four-bit bus configuration to data bus 732. The data output bond pads of the three dies in each of die stacks 704, 716, and 722 are similarly electrically connected in a four-bit bus configuration to data buses 730, 734, and 736. As shown in FIG. 7A, data buses 730, 732, 734, and 736 are electrically connected to edge connectors 728 on wiring substrate 702.

Referring again to FIG. 7C, connection 638 electrically connects one address bond pad on each die 602, 604, and 606 to each other and to one trace of address/command bus 738. Connections 640 and 642 similarly electrically connect one address bond pad on each die 602, 604, and 606 to each other and to one trace of address/command bus 738. The address bond pads of each of the dies 602, 604, and 606 in the die stack 710 are thus all connected in a three-bit bus configuration to three traces of address/command bus 738. As also shown in FIG. 7C, the other three traces of bus 738 are electrically connected to one of the die enable bond pads 623, 625, or 627 of dies 602, 604, and 606. It should be noted that the data bond pads of each die in each die stack 704, 710, 716, and 722 are preferably oriented as exemplified in FIG. 7C, that is, disposed adjacent the traces of one of data buses 730, 732, 734, or 736. Likewise, the address bond pads and die enable bond pads of each die in each die stack 704, 710, 716, and 722 are preferably oriented as exemplified in FIG. 7C, that is, disposed adjacent the traces of address/command bus 738. Thus, as discussed above, the dies in each stack 704, 710, 716, and 722 may be arranged such that bond pads on each die that correspond to a common signal type or function (e.g., bit 2 in an address word, bit 4 in a data word, a read control signal, etc.) are aligned one with another, and each stack 704, 710, 716, and 722 may be disposed on the wiring substrate 702 such that those bond pads sharing a common signal type or function are aligned with a trace on the wiring substrate 702 that also shares the common signal type or function.

As shown in FIG. 7A, each of the traces of address/command bus 738 may be electrically connected to one of edge connectors 728 by electrically conductive internal traces 706 and 708 disposed on an internal layer of wiring substrate 702 and vias that extend from the internal traces 706 and 708 to the traces of address/command bus 738. (Note that traces 706 and 708 are shown in FIG. 7A in dashed lines to indicate that they are located within wiring substrate 702.) It should be apparent that the wiring substrate 702 of FIG. 7A may thus provide all of the needed electrical connections to and from and between the dies in the die stacks 704, 710, 716, and 726 using only two layers of wiring.

As shown in particular in FIG. 7B, the exemplary address/command bus 738 extends under die stacks 710 and 716, which may be attached to the wiring substrate 702 so as to be insulated from and not interfere with the traces of address/command bus 738. Other electronic elements may be included in the module 700. For example, a register die 740 for buffering address and command signals on address/command bus 738 may be included. As shown in FIG. 7A, register die 740 may be disposed over one or more of the traces of address/command bus 738 so as to electrically connect to selected traces but otherwise be insulated from and not interfere with signals on the address/command bus 738. Yet other electronic components (not shown) may be included, including without limitation resistors and decoupling capacitors.

In operation, the exemplary multi-stack module 700 shown in FIG. 7A operates as follows. A three-bit address and a die enable signal is placed on address/command bus 738, which selects one die in each stack 704, 710, 716, and 722 and causes each selected die to output a four-bit word, corresponding to the address placed on the address/command bus 738, to data output bus 730, 732, 734, or 736. Thus, as configured in FIGS. 7A-7C, in response to a three-bit address and a die enable signal on address/command bus 738, the multi-stack module 700 outputs a sixteen-bit data word onto data buses 730, 732, 734, and 736.

Connections 630, 632, 634, 636, 638, 640, and 642 may be similar to connections 130, 132, 134, and 136 in FIGS. 1 and 2, and connections 644, 646, and 648 may be similar to connections 144, 146, and 148 in FIGS. 1-3.

As mentioned above, the exemplary multi-stack module 700 shown in FIGS. 7A-7C is exemplary only and need not be a read-only memory module. For example, the multi-stack module 700 may be any type of memory module, including without limitation any type of random access memory (e.g., dynamic random access memory (DRAM), static random access memory (SRAM), non-volatile random access memory (NVRAM)), any type of flash memory, or any other type of memory. As yet another example, the multi-stack module 700 need not be a memory module. Rather, the multi-stack module 700 may be any type of multi-die module. For example, each stack may comprise one microprocessor and one or more memory dies and thus each stack may be a self-contained processing unit. As just one such example, one die may be a processor, another die may be a read-only memory for storing program code that is executed on the processor, and the other die may be a read/write memory (e.g., a so called random access memory). As yet another example, the die stacks need not be the same. For example, die stack 704 may have different die types than die stack 710. Thus, for example, die stack 704 may include a processor die and two memory dies, and die stacks 710, 716, and 722 may include all memory dies, providing additional memory for the processor in die stack 704. As another example, one or more of the stacks 704, 710, 716, 722 may have a different number of dies. For example, die stack 704 may include three dies, die stack 710 may include two dies, die stack 716 may include one die, and die stack 722 may include ten dies.

Figure 8:
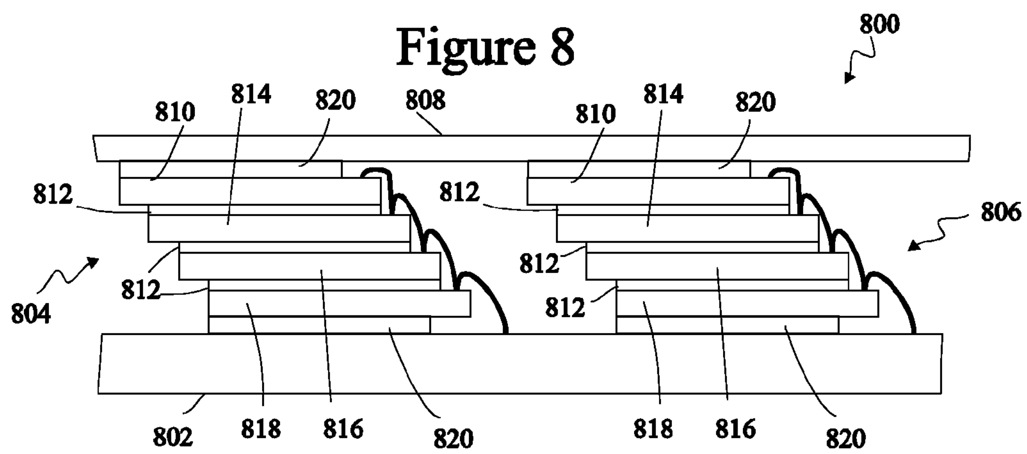
FIG. 8 illustrates an exemplary multi-stack module with heat dissipating elements.

FIG. 8 illustrates a partial view of a multi-stack module 800 that includes heat dissipating elements but may be otherwise generally similar to multi-stack module 700. Shown in the partial view of FIG. 8 are two die stacks 804 and 806, each of which includes dies 810, 814, 816, and 818. Attachment elements 812 (which may be like attachment elements 108 and 110 in FIGS. 1 and 3 above) secure dies 810, 814, 816, and 818 to each other as shown in FIG. 8. A heat conductive element 820 is disposed on an outer die 810 in each stack 804 and 806 and thermally connected to a heat spreader 808 for dissipating heat generated by the dies in each stack. Another heat conductive element 820 may connect the other outer die 818 in each stack 804 and 806 to the wiring substrate 802 (which may be generally like wiring substrate 112) to dissipate heat from the dies to the wiring substrate 802. Attachment elements 812 may also be heat conductive to help conduct heat away from the die stacks 804 and 806 towards the heat spreader 808 and the wiring substrate 802.

Figure 9:
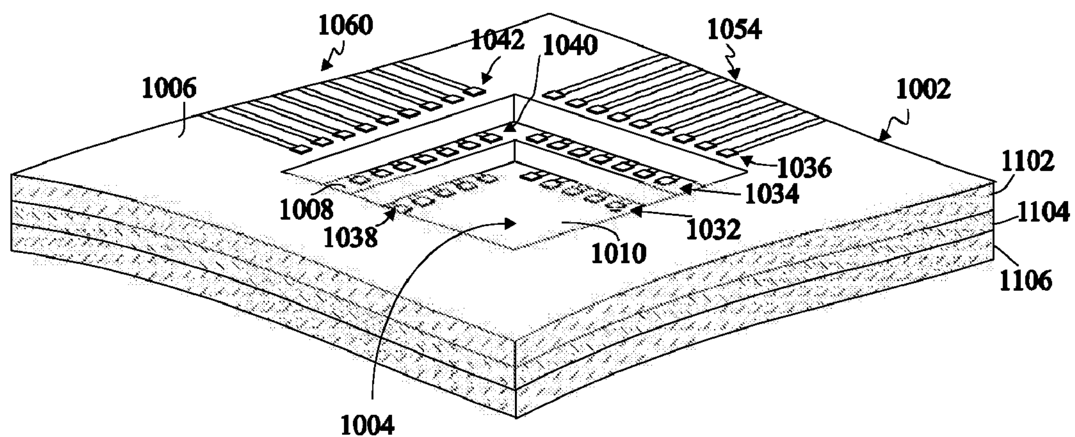
FIG. 9 illustrates a perspective partial view of a wiring substrate having a cavity configured to receive a die stack.
Figure 11:
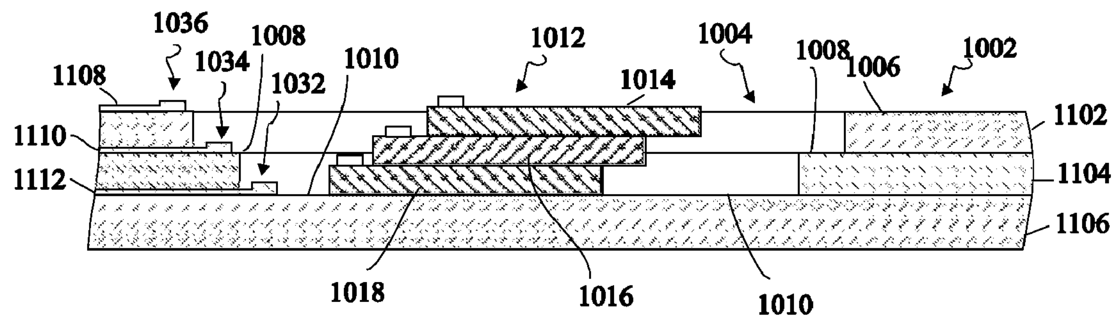
FIG. 11 illustrates a cross-sectional side view taken of FIG. 10.
Figure 10:
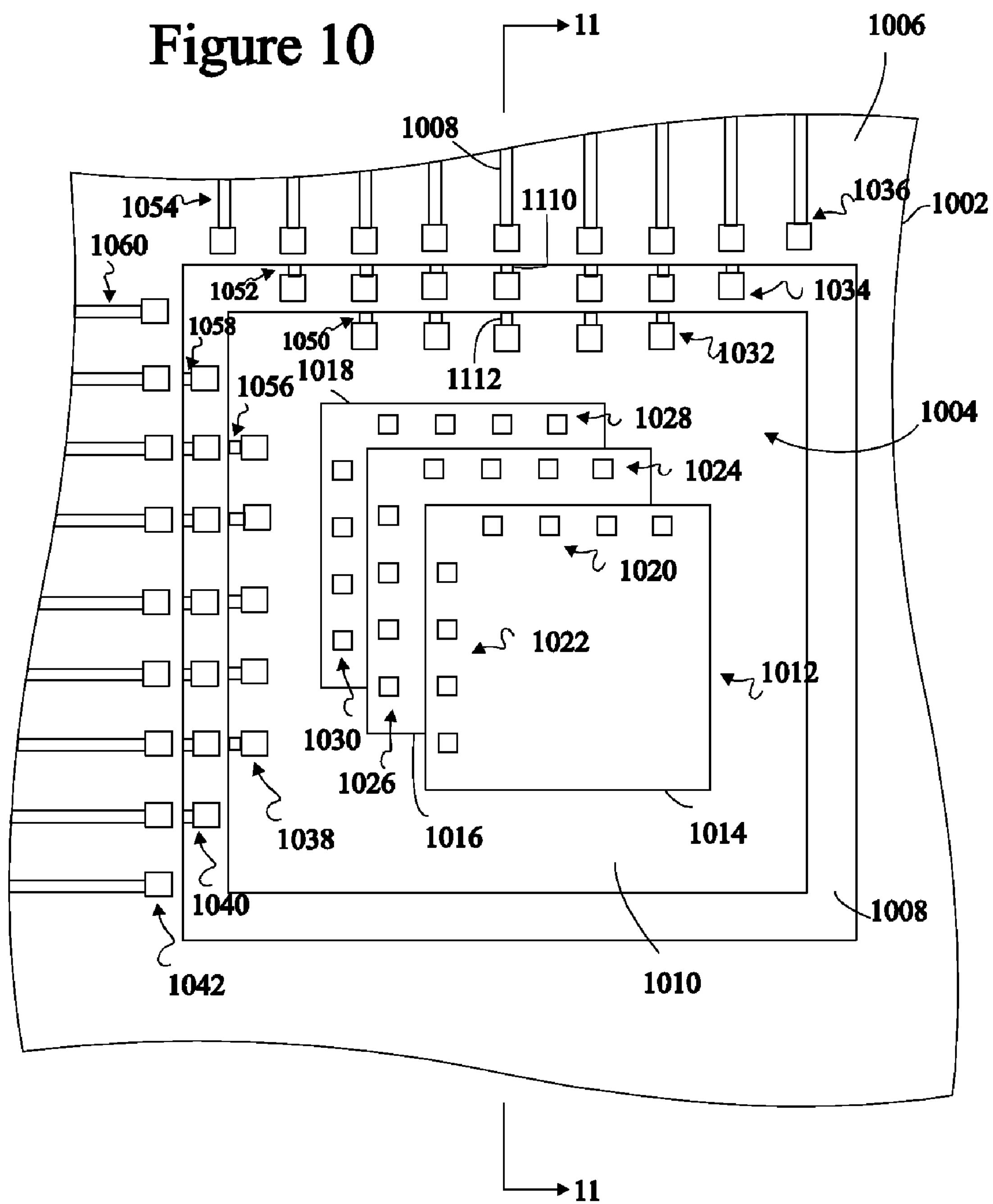
FIG. 10 illustrates a top partial view of the wiring substrate of FIG. 9, including a die stack disposed in the cavity.

FIGS. 9, 10, and 11 illustrate placement of a die stack 1012 in an exemplary tiered cavity 1004 in a multi-layered wiring substrate 1002. FIG. 9 illustrates a partial view of such a wiring substrate 1002 showing one cavity 1004 without a die stack. FIG. 10 illustrates a top partial view of the wiring substrate 1002 with a die stack 1012 disposed in the cavity 1004, and FIG. 11 shows a cross-sectional side view of FIG. 10.

The exemplary wiring substrate 1002 shown in FIGS. 9-11 includes three layers 1102, 1104, and 1106. Each layer may comprise any type of wiring substrate (e.g., a printed circuit board, etc.) The bottom of cavity 1004 is the top surface 1010 of layer 1106, and two rows of terminals 1038 and 1032 are disposed within cavity 1004 on the top surface 1010 of layer 1106 as shown in FIGS. 9-11. Traces 1056 (see FIG. 10) electrically connect the terminals in terminal row 1038 to other parts of the wiring substrate 1002, and traces 1050 (see FIG. 10) similarly electrically connect the terminals in terminal row 1032 to other parts of the wiring substrate 1002. (One trace 1112 of trace set 1050 is shown in FIG. 11.)

As also shown in FIGS. 9-11, a portion of the top surface 1008 of layer 1104 is exposed to form a ledge, and two rows of terminals are disposed on that ledge: terminal row 1040, and terminal row 1034. Two additional rows of terminals 1042 and 1036 are disposed on the surface 1006 of layer 1102 adjacent the cavity 1004: terminal row 1036, and terminal row 1040. Traces 1058 (see FIG. 10) electrically connect the terminals in terminal row 1040 to other parts of the wiring substrate 1002, and traces 1052 similarly electrically connect the terminals in terminal row 1034 to other parts of the wiring substrate 1002. (One trace 1110 of trace set 1052 is shown in FIG. 11.) Likewise, traces 1060 (see FIG. 10) electrically connect the terminals in terminal row 1042 to other parts of the wiring substrate 1002, and traces 1054 similarly electrically connect the terminals in terminal row 1036 to other parts of the wiring substrate 1002. (One trace 1108 of trace set 1054 is shown in FIG. 11.)

As best seen in FIG. 10, die stack 1012 includes three dies 1014, 1016, and 1018, each of which includes two rows of bond pads disposed along an edge of the die, and the dies 1014, 1016, and 1018 are stacked in an offset manner as generally described above with respect to die stack 100 in FIGS. 1-3. (Die stack 1012 may be generally similar to die stack 100.) Still referring to FIG. 10, die 1014 includes bond-pad rows 1020 and 1022; die 1016 includes bond-pad rows 1024 and 1026; and die 1018 includes bond-pad rows 1028 and 1030. Although no connections are shown in FIGS. 9-11, any of the bond pads in bond-pad rows 1020, 1022, 1024, 1026, 1028, and 1030 may be electrically connected to each other and/or to any of the terminals in terminal rows 1032, 1034, 1036, 1038, 1040, and 1042. Such connections may be similar to connections 130, 132, 134, 136, 138, 140, 142, 144, 146, and 148 shown in FIGS. 1-3 and discussed above. That is, connections 130, 132, 134, 136, 138, 140, 142, 144, 146, and 148 may comprise wire bonds.

The use of die-stacks and/or a wiring substrate with tiered cavities, such as those described herein, has several advantages. For example, such die-stacks and/or a wiring substrates are compatible with the use of bare, unpackaged dies. As another example, the complexity of interconnecting the dies with each other and with the wiring substrate can be reduced. As can be seen in FIG. 7B, the number of traces on the wiring substrate 702 that must cross over each other can be minimized. In FIG. 7B, for example, only six traces 706, 708 on wiring substrate 702 cross over address/command bus 738. Wiring substrate 702 thus need have only two different wiring layers. And minimizing the number of cross-over traces also minimizes the number of vias needed between layers, which can significantly reduce the size of wiring substrate 702 because vias are typically several times wider than a trace. As can be seen in FIG. 7C, the number of interconnections between dies in a stack that must cross over each other can also be minimized. This can reduce, among other problems, cross-talk problems.

Indeed, with proper orientation of each die in a stack with respect to other dies in the stack and with respect to conductive traces on the wiring substrate, the cost of the wiring substrate may be reduced or minimized. Factors that affect the cost of the wiring substrate include without limitation the number of layers of signal traces (e.g., as discussed above, the exemplary wiring substrate 702 in FIG. 7B has two layers of signal traces), the number of conductive vias required to interconnect signal traces disposed on different layers of the wiring substrate, the maximum allowed width of signal traces on and within the wiring substrate, and the size of the wiring substrate. Of course, the fewer the number of signal layers, the fewer the number of vias, the smaller the wiring substrate, and the greater the maximum allowed width of signal traces, the lower the cost of the wiring substrate. Thus, the cost or cost function of the wiring substrate may be reduced or minimized by reducing the number of trace layers, the number of vias, and/or the size of the wiring substrate, and the cost or cost function of the wiring substrate may also be reduced, alternatively or additionally, by increasing the maximum allowable width of the traces on the wiring substrate.

Two exemplary, nonlimiting orientation techniques discussed herein for reducing or minimizing the cost of the wiring substrate are as follows: referring to FIGS. 7A-7C, and as previously discussed, the dies in each stack 704, 710, 716, and 722 are oriented such that bond pads on each die that correspond to a common signal type or function (e.g., bit 2 in an address word, bit 4 in a data word, a read control signal, etc.) are aligned one with another, and each stack 704, 710, 716, and 722 is disposed on the wiring substrate 702 such that those bond pads sharing a common signal type or function are aligned with trace on the wiring substrate 702 that also shares the common signal type or function.

Figure 12:
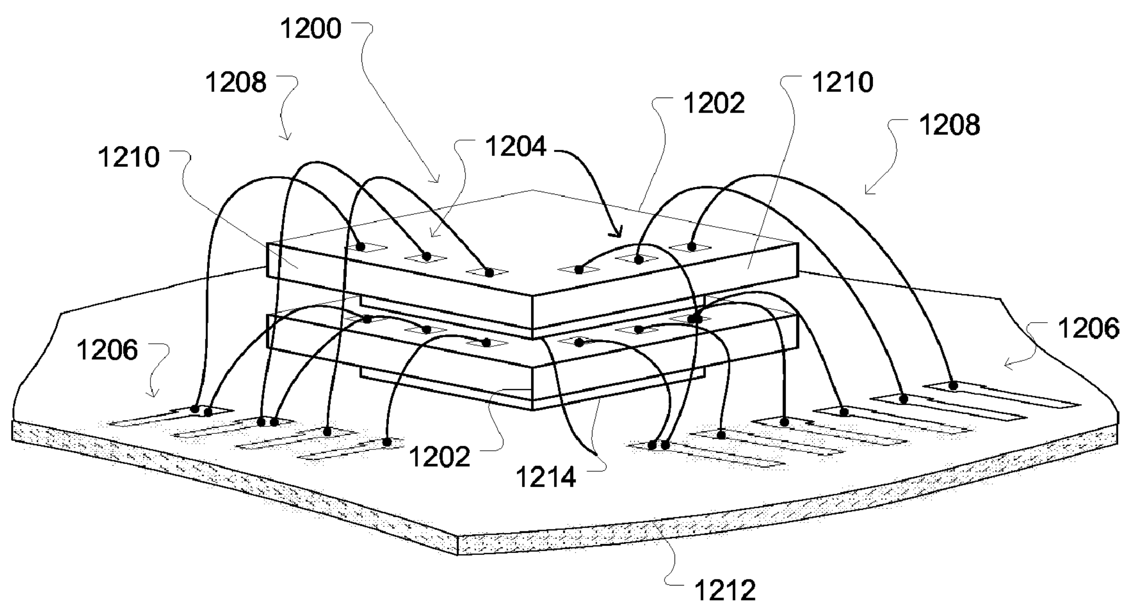
FIG. 12 illustrates a perspective view of another exemplary die stack.

FIG. 12 illustrates another exemplary die stack 1200, which as shown, includes a plurality of dies 1202 (two are shown but more or fewer dies 1202 may be included in the stack 1200). Dies 1202 may be generally similar to dies 102, 104, 106 of FIG. 1. As shown, each die 1202 includes a row of bond pads 1204 located along each of two edges 1210 of the die 1202. In FIG. 12, the dies 1202 are attached to each other and to a wiring substrate 1212 by attachment elements 1214. Wiring substrate 1212 may be similar to wiring substrate 112 of FIG. 1 and includes conductive traces 1206, which may be like traces 120, 128 of FIG. 1. Attachment elements 1214 may be similar to attachment elements 108, 110 in FIG. 1. As shown in FIG. 12, a plurality of connections 1208 (which may be similar to any of connections 130, 132, 134, 136, 138, 140, 142, 144, 146, 148 of FIG. 1) electrically connect one or more bond pads 1204 to one or more traces 1206. Unlike the die stack 100 shown in FIG. 1, however, the edges 1210 of the dies 1202 in the stack 1200 of FIG. 12 are not offset but are aligned such that each edge 1210 of the upper die 1202 in stack 1200 is positioned directly above a corresponding edge 1210 of the lower die 1202 in stack 1200. Although not shown in FIG. 12, the stack 1200 could alternatively be configured such that one of the two edges 1210 of the upper die 1202 is positioned directly above a corresponding edge 1210 of the lower die 1202 (as shown in FIG. 12) and the other edge 1210 of the upper die 1202 is offset from the corresponding edge 1210 of the lower die 1202 (as in FIG. 1). In either configuration, the die stack 1200 may be substituted for any die stack illustrated in the figures and/or discussed herein. Although also not shown, bond pads 1204 may be included on both sides of one or more of dies 1202, and indeed, bond pads may be included on both sides of any of the dies disclosed in any of the figures.

Although exemplary embodiments and applications of the invention have been described herein, there is no intention that the invention be limited to these exemplary embodiments and applications or to the manner in which the exemplary embodiments and applications operate or are described herein.

What is claimed is:

1. A multi-die module comprising:

a stack comprising a plurality of semiconductor dies, each said semiconductor die comprising a plurality of terminals disposed in a first row along a first edge of said die and a second row along a second edge of said die, wherein said plurality of semiconductor dies are configured in said stack such that said first edges of each of said dies in said stack are oriented in a same direction and said second edges of each of said dies in said stack are oriented in a same direction, and ones of said terminals that correspond to a common signal function are disposed in a same orientation on each of said dies in said stack;

a wiring substrate comprising a plurality of traces disposed on a surface of said wiring substrate, said stack disposed on said surface of said wiring substrate such that said terminals on each of said dies face away from said surface of said wiring substrate; and a plurality of electrical connections each electrically connecting one of said traces with at least one of said terminals.

2. The multi-die module of claim 1, wherein terminals that function to receive address signals are disposed in a same orientation on each of said dies.

3. The multi-die module of claim 1, wherein terminals that function to receive data signals are disposed in a same orientation on each of said dies.

4. The multi-die module of claim 1, wherein terminals that function to receive control signals are disposed in a same orientation on each of said dies.

5. The multi-die module of claim 1, wherein said dies in said stack are offset one from another exposing said first row of terminals and said second row of terminals on each of said dies.

6. The multi-die module of claim 1, wherein said plurality of semiconductor dies comprises at least three dies.

7. The multi-die module of claim 1, wherein said stack is disposed on said wiring substrate in an orientation in which ones of said terminals of said dies that correspond to a particular signal function are disposed in a same orientation as ones of said traces that correspond to said particular signal function.

8. The multi-die module of claim 7, wherein ones of said traces comprise a signal bus on said wiring substrate, each of ones of said electrical connections electrically connecting one of said traces of said bus to a plurality of terminals of said dies, said ones of said electrical connections forming a signal bus that electrically connects said signal bus on said wiring substrate to said dies.

9. The multi-die module of claim 1, wherein each die comprises a plurality of traces electrically connecting a set of native bond pads of said die to said first row of terminals and said second row of terminals.

10. The multi-die module of claim 1 further comprising a heat dissipating element in thermal connection with at least one of said dies.

11. The multi-die module of claim 1, wherein each of first ones of said electrical connections connect terminals on each of said dies that have a first same signal function, wherein said first ones of said electrical connections form a first signal bus to which each of said dies is connected.

12. The multi-die module of claim 11, wherein each of second ones of said electrical connections connect terminals on each of said dies that have a second same signal function, wherein said second ones of said electrical connections form a second signal bus to which each of said dies is connected.

13. The multi-die module of claim 12, wherein said first signal bus is an address bus and said second signal bus is a data bus.

14. The multi-die module of claim 13, wherein said address bus comprises at least three of said first ones of said electrical connections electrically connecting f at least three terminals on at least two different ones of said dies, each of said at least three of said first electrical connections corresponding to a different bit of said address bus.

15. The multi-die module of claim 14, wherein said data bus comprises at least three of said second ones of said electrical connections electrically connecting at least three terminals on said at least two different ones of said dies, each of said at least three of said second electrical connections corresponding to a different data bit of said data bus.

16. The multi-die module of claim 1, wherein said dies are bare and unpackaged.

17. The multi-die module of claim 1, wherein:

ones of said terminals on each of said dies are address terminals configured to receive signals representing an address within said die, and said address terminals are disposed in a same orientation on each of said dies in said stack.

18. The multi-die module of claim 1, wherein:

ones of said terminals on each of said dies are data bus terminals configured to receive signals representing data input to or output from said die, and said data bus terminals are disposed in a same orientation on each of said dies in said stack.

19. The multi-die module of claim 1, wherein:

ones of said terminals on each of said dies are control signal terminals configured to receive signals for controlling said die, and said control signal terminals are disposed in a same orientation on each of said dies in said stack.

20. The multi-die module of claim 1, wherein:

first ones of said electrical connections are each coupled to one of said traces of said wiring substrate and one of said terminals on each of said dies that are in a same orientation on each of said dies and correspond to a same signal function; and second ones of said electrical connections are each coupled to one of said traces of said wiring substrate and one and only one terminal on one and only one die.

21. The multi-die module of claim 20 further comprising electrical connections each coupled to a plurality of terminals on different ones of said dies in said stack without being coupled to one of said traces of said wiring substrate.

22. The multi-die module of claim 1, wherein every set of terminals on two or more of said dies that corresponds to a same signal function are disposed in a same orientation on each of said two or more dies.

* * * * *